United States Patent
Hellig et al.

(10) Patent No.: US 6,696,334 B1
(45) Date of Patent: Feb. 24, 2004

(54) METHOD FOR FORMATION OF A DIFFERENTIAL OFFSET SPACER

(75) Inventors: Kay Hellig, Dresden (DE); Srikanteswara Dakshina-Murthy, Sunnyvale, CA (US); Christoph Schwan, Gebhardshain (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/260,485

(22) Filed: Sep. 30, 2002

(51) Int. Cl.[7] .......................... H01L 21/8238
(52) U.S. Cl. ....................... 438/230; 438/595
(58) Field of Search ...................... 438/199, 230, 438/231, 232, 595

(56) References Cited

U.S. PATENT DOCUMENTS 5,696,012 A * 12/1997 Son .......................... 438/231

OTHER PUBLICATIONS

Wolf, "Silicon Processing for the VLSI Era", vol. 1, pp. 182–195, 539–547, 555–557, 565–567.*

* cited by examiner

Primary Examiner—Chandra Chaudhari
(74) Attorney, Agent, or Firm—Toler, Larson & Abel, LLP

(57) ABSTRACT

A method for differential offset spacer formation suitable for incorporation into manufacturing processes for advanced CMOS-technologies devices is presented. The method comprises forming a first insulative layer overlying a plurality of gate structures, then forming a second insulative layer overlying the first insulative layer. A mask is formed to expose a first portion of the second insulative layer overlying a gate structure of a first transistor type, and to protect a second portion of the second insulative layer overlying a gate structure of a transistor of a second transistor type. The exposed first portion of the second insulative layer overlying the gate structure of the first type is then etched. After etching, the mask is removed, and the exposed second portion of the second insulative layer and the first insulative layer are etched to form differential spacers abutting the gate structures. Endpoint is utilized to halt the spacer etch process.

19 Claims, 6 Drawing Sheets

METHOD FOR FORMATION OF A DIFFERENTIAL OFFSET SPACER

FIELD OF THE DISCLOSURE

The present invention relates generally to a semiconductor manufacturing process, and more particularly to a method for formation of spacers in a semiconductor manufacturing process.

BACKGROUND

The main technology for ultra large-scale integrated (ULSI) circuits is Complementary Metal-Oxide-Semiconductor (CMOS) technology. High-performance CMOS technologies commonly employ various processes to form offset spacers, nitride spacers, and Self-ALIgned SiliCIDE (salicide) formation. Offset spacers-0 serve to place e.g., shallow source/drain (S/D) extensions and/or halo implants some distance, e.g., 5 to 20 nm, from a gate edge. Varying the width of the offset spacers-0 has been used to adjust the channel lengths of the P-channel MOS (PMOS) and N-channel MOS (NMOS), as well as to reduce the overlap capacitance, known as the Miller capacitance, between the gate electrode and the source/drain (S/D) region. Spacers in general serve also to place, e.g., deep S/D implants from the gate. In addition, spacer-0s have been used for several other types of implant processes, e.g., xenon pre-amorphization implants. Offset spacers typically consist of silicon oxide or silicon nitride.

While increasing the width of spacer-0 decreases the overlap between S/D extensions and the gate, thus reducing the Miller capacitance and improving device performance, if spacer-0 is too wide, a condition referred to as "under-lap" occurs. With under-lap, the S/D extensions no longer reach the gate and device performance degrades. Hence, it is important to control the width of spacer-0 during device manufacture.

CMOS-technologies regularly employ both NMOS and PMOS transistors within the same device, as seen in FIG. 1. FIG. 1 illustrates a cross-sectional view of a MOSFET device 100 manufactured with both a PMOS transistor 110 and NMOS transistor 115 according to the prior art. PMOS and NMOS transistors 110 and 115 utilize different dopant materials for S/D implantation. For example, arsenic (As) may be the implant species for the N-type implanted S/D extension areas 117 adjacent NMOS gate 118 and NMOS spacer-0 119, while another species such as boron (B) may be used for the P-type implanted S/D extension areas 121 adjacent PMOS spacer-0 123 and PMOS gate 125. NMOS and PMOS transistors 115 and 110 are separated by an isolation area 127, and are constructed on substrate 130. Details of the S/D areas 117 and 121 are not shown in FIG. 1.

During the thermal annealing required for the S/D extension areas 117 and 121 for dopant activation, the smaller boron atoms in extension areas 117 diffuse much more than those of the larger arsenic atoms in extension areas 121. As a result, the PMOS S/D extension areas 121 will have a larger overlap with PMOS gate 125 than will be the case with S/D extensions 117 and NMOS gate 118. When the width Z of spacer-0s 119 and 123 are the same, it is not possible to prevent this larger overlap in S/D extension 121 or underlap in S/D extension 117. To overcome this problem, process engineers have devised processes to adjust the width Z of spacer-0 123 independently of that of spacer-0 119. Creating different spacer-0 widths, or "differential" spacer widths for the NMOS spacer-0 119 and the PMOS spacer-0 123, as seen in FIG. 2, solves the unequal diffusion problem.

FIG. 2 illustrates a cross-sectional view of a MOSFET device 200 created with differential spacers according to the prior art. As seen in FIG. 2, the width W of spacer-0 223 is wider than the width X of the NMOS spacer-0 219. The process sequence outline to form differential width spacers such as spacer-0 223 as shown in FIG. 2 typically proceeds as follows:

1. Deposit 100 Angstroms of silicon oxide overlying NMOS gate218, PMOS gate 225, substrate 230 and isolation area 227
2. Anisotropically etch the 100 Angstrom oxide, stopping on the silicon 217, 221, which leaves a 100 Angstrom thick spacer-0 on both NMOS and PMOS transistor gates (218 and 225)
3. Mask off PMOS transistor 210 with a photo resist mask
4. Implant S/D extensions 217 for NMOS transistor 215 using the 100 Angstrom spacer-0
5. Remove the photo resist protecting the PMOS transistor 210 regions
6. Deposit 50 Angstroms of silicon oxide overlying NMOS gate218, PMOS gate 225, substrate 230 and isolation area 227
7. Anisotropically etch the 50 Angstroms of silicon oxide, stopping on the silicon, which leaves spacer-0 223 with 150 Angstroms total width W
8. Mask off NMOS transistor 215 with a photo resist mask
9. Implant S/D extensions 221 for PMOS transistor 210 using the 150 Angstrom spacer-0 width (W)
10. Remove the photo resist protecting the NMOS transistor 215

There are various assumptions made in the process sequence of 1–10 above, e.g., the width values given are arbitrary values; no lateral etching occurs during the anisotropic etch; halo implants are not mentioned; and the NMOS transistor 215 may be made wider than the PMOS transistor 210 using the same process sequence. Should lateral etching occur, the process engineer generally compensates by increasing the deposition thickness of the silicon oxide accordingly. Halo implants are usually done together with the S/D extension implants, but may also be done at an earlier or later stage in the process sequence.

Although the process sequence outlined above addresses the diffusion problem, there are various drawbacks associated with the approach as well. For example, the process sequence requires at least two separate plasma etch steps. Plasma etch steps are expensive processes. In addition, oxide-spacer-0 etch processes result in some inherent silicon loss (silicon recess) in the S/D extension regions. Ideally, no recess should exist between the edges of the gates/spacer-0 and the active silicon, as device performance is adversely affected. In FIGS. 1 and 2, no silicon recess is illustrated. Unfortunately, in practice the etch process for an oxide spacer-0 typically seems to produce at least a 2.5 nm (25 Angstrom) recess per etch, with resultant device performance degradation. To minimize this silicon recess, the spacer-0 etch process should not etch even 1 or 2 nm into the active silicon. The second etch process (No. 7, above) step contributes further to silicon recess because the thin (50 Angstrom) oxide layer is difficult to control and endpoint. Using an etch endpoint is desirable in order to compensate for some variations, e.g., layer thickness variations, process chamber variations, and the like, and to reduce the amount of over-etch applied.

Therefore, a method for forming differential spacers during the CMOS production flow which overcomes the limitations of current processes would be useful.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements for clarity. Other advantages, features and characteristics of the present disclosure, as well as methods, operation and functions of related elements of structure, and the combinations of parts and economies of manufacture, will become apparent upon consideration of the following description and claims with reference to the accompanying drawings, all of which form a part of the specification, wherein like reference numerals designate corresponding parts in the various figures, and wherein:

DETAILED DESCRIPTION OF THE FIGURES

Figure 1:
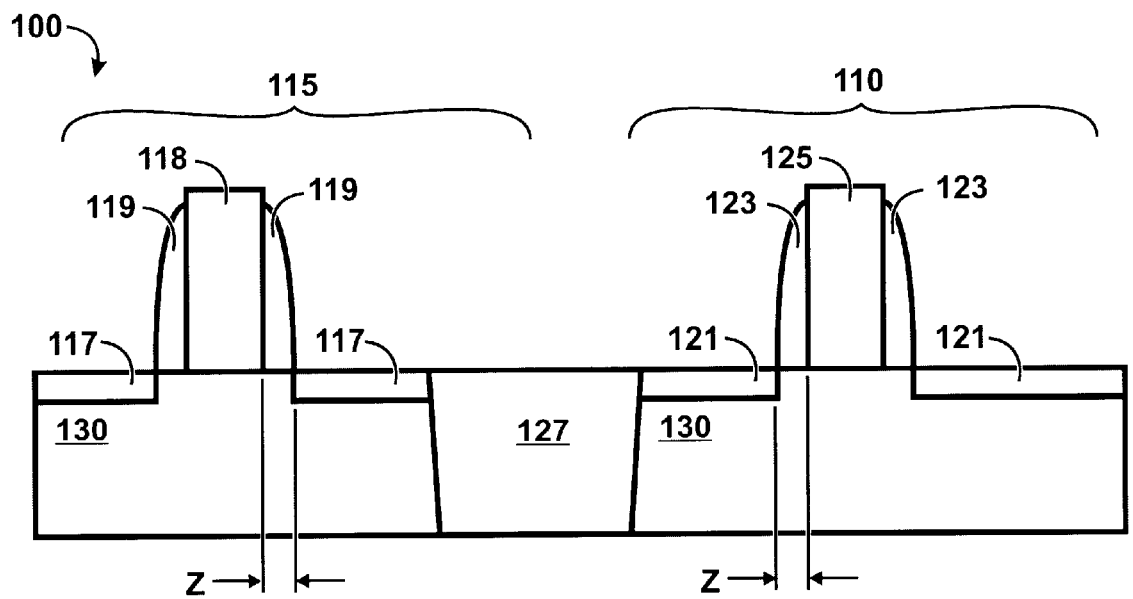
FIG. 1 illustrates a cross-sectional view of a MOSFET device manufactured with both PMOS an NMOS transistors according to the prior art.
Figure 2:
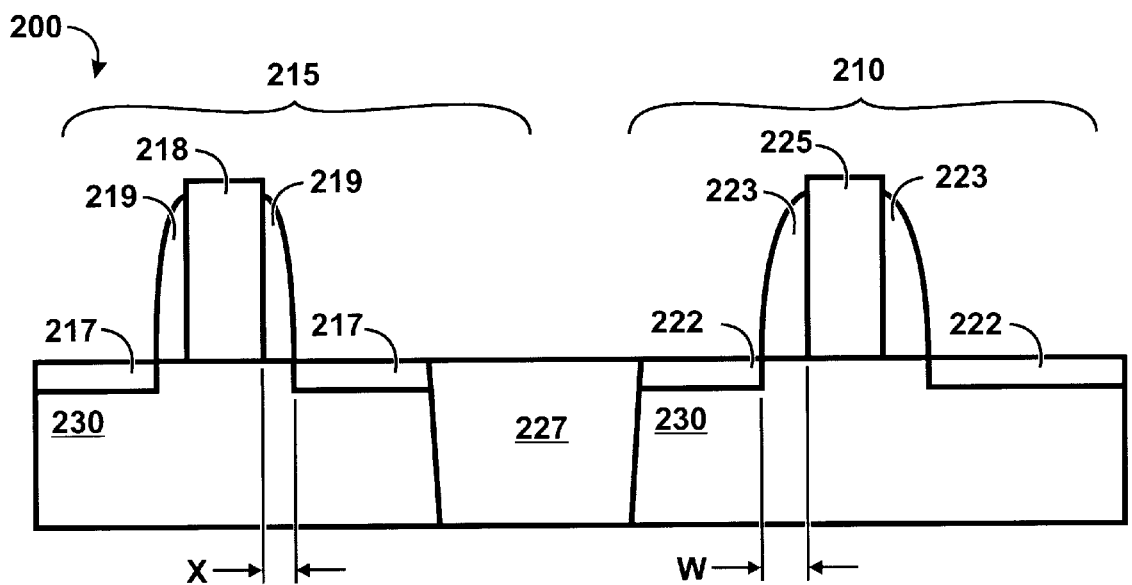
FIG. 2 illustrates a cross-sectional view of a MOSFET device created with differential spacers according to the prior art.

The present disclosure provides a method for differential spacer formation suitable for incorporation into the manufacturing process for high-performance CMOS integrated circuit semiconductor devices. The method creates a differential spacer-0 for gate structures by means of a dual layer stack and selective etch chemistries. In addition, the method can be used to form differential spacers without the additional masking and etching processes typically required in conventional processing with commonly used etch chemistries. In an embodiment, the differential spacer-0 is wider for PMOS gate structures than for NMOS gate structures. However, should a wider NMOS spacer-0 be desired, the teachings herein may be applied to form NMOS gate structure spacer-0s which will be wider than the spacer-0s for PMOS gate structures. It should be noted that although the present disclosure primarily discusses formation of differential spacer-0s, the teachings could be applied to other spacer formation, e.g., spacer-1, or spacers for deep source/drains.

In an embodiment, the method forms differential spacer-0s by means of a dual layer stack with a first layer of silicon oxide, and a second layer of silicon nitride. The nitride layer is selectively removed over the NMOS structures, with the remaining stack/layer then being etched to form spacers of different width. FIGS. 3 through 7 illustrate the formation of these differential spacers.

In another embodiment, the method forms differential spacer-0s by means of a dual layer stack with a first layer of silicon nitride, and a second layer of silicon oxide. The oxide layer is selectively removed over the NMOS structures, with the remaining stack/layer then being etched to form spacers of different width. FIGS. 8 through 12 illustrate the formation of these differential spacers.

FIGS. 3 through 7 illustrate, in cross-section, a portion 300 of a semiconductor device in an intermediate stage of processing according to an embodiment of the present disclosure. At the stage shown in FIG. 3, the isolation 327 in substrate 330, an N-type gate structure 319, and a P-type gate structure 325 have been formed. Semiconductor substrate 330 is preferably a mono-crystalline silicon substrate. Alternatively, substrate 330 can also be a silicon-on-insulator substrate, a silicon on sapphire substrate, or the like. N-type gate structure 319 and P-type gate structure 325 are preferably polysilicon, amorphous silicon, metals, or ceramic conductors having a width ranging from 5 to 500 nm. The brackets indicate the areas of portion 300 which form transistors corresponding to a particular type of gate structure. Thus, N-type gate structure 319 is part of an NMOS transistor 315, while P-type gate structure 325 is part of a PMOS transistor 310.

A first insulative layer 333 is formed overlying a plurality of gate structures such as gate structure 319 and gate structure 325 of portion 300. In a preferred embodiment, first insulative layer 333 is conformally deposited by techniques well known in the art, e.g., LCPVD, PECVD, etc., and comprises a silicon oxide. Alternatively, first insulative layer 333 comprises a silicon-rich oxide. In other embodiments illustrated and discussed with reference to FIGS. 8–12, first insulative layer 333 comprises silicon nitride, or a silicon-rich nitride. In another embodiment, first insulative layer comprises silicon, nitrogen, and oxygen, e.g., a silicon oxynitride. The thickness of first insulative layer ranges from 50 to 500 Angstroms. For purposes of example, we shall utilize an arbitrary value of 100 Angstroms for the thickness of first insulative layer 333 with reference to FIGS. 3–7. Following formation of the first insulative layer 333, a second insulative layer 335 is formed overlying the first insulative layer 333.

Second insulative layer 335 is conformally deposited by techniques well known in the art, e.g., LPCVD, PECVD, etc., and preferably comprises silicon nitride. Alternatively, second insulative layer 335 comprises a silicon-rich nitride. In an embodiment, second insulative layer 335 comprises silicon, nitrogen, and oxygen, e.g., silicon oxynitride. The thickness of second insulative layer ranges from 30 to 300 Angstroms. For purposes of example, we shall utilize an arbitrary value of 50 Angstroms for the thickness of second insulative layer 335 with reference to FIGS. 3 through 7. After formation of second insulative layer 335, portion 300 is ready for masking, as seen in FIG. 4.

Figure 3:
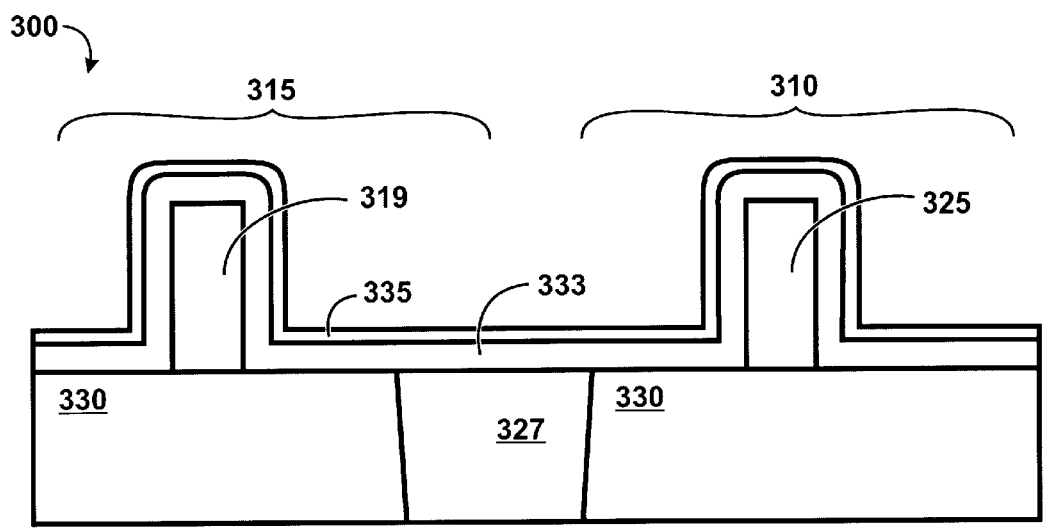
FIGS. 3–7 illustrate, in cross-section, semiconductor device manufacturing process steps according to at least one embodiment of the present disclosure.
Figure 4:
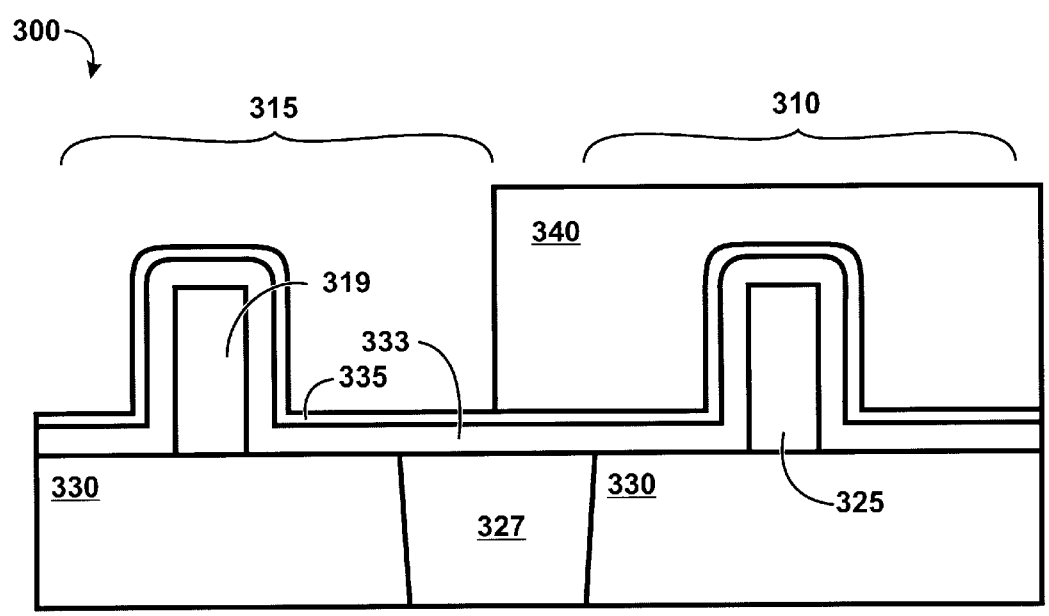

FIG. 4 illustrates portion 300 of FIG. 3 after masking areas of portion 300 for a photolithography process. A first photo resist mask layer 340 is formed to expose a first portion of the second insulative layer 335 where second insulative layer 335 overlies a gate structure of a first transistor type, e.g., the NMOS transistor 315. Mask layer 340 also serves to protect a second portion of the second insulative layer 335 where layer 335 overlies a gate structure of a second transistor type, e.g., the PMOS transistor 310. Following the application of mask 340 for the photolithographic process, portion 300 is subjected to an etch to remove the exposed portion of the second insulative layer 335, as shown in FIG. 5.

Figure 5:
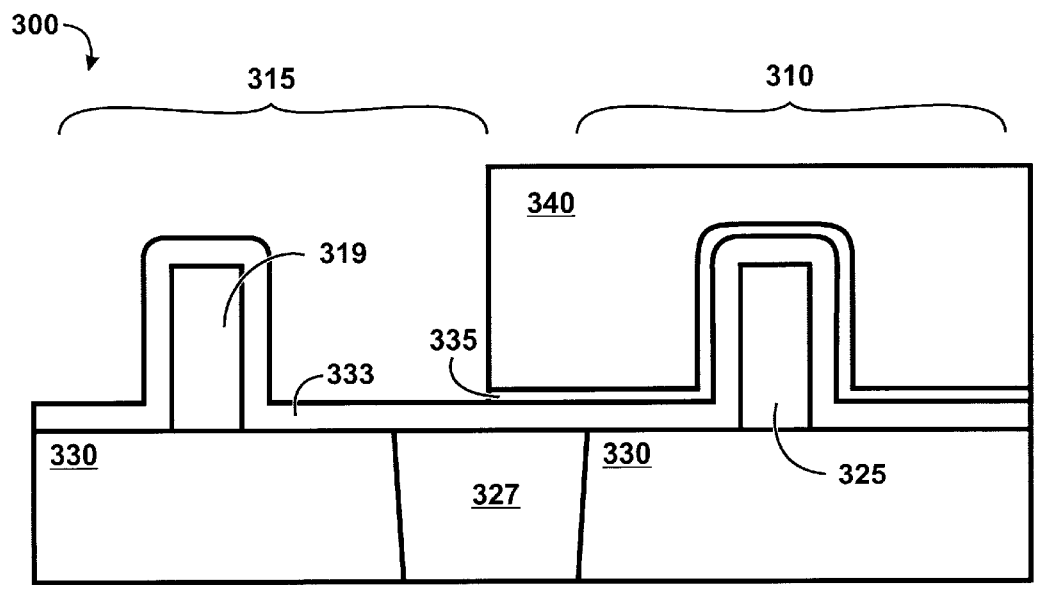

FIG. 5 illustrates portion 300 of FIG. 4 after etching to remove the exposed first portion of the second insulative layer 335 from the NMOS transistor 315. Etch of the exposed first portion of second layer 335 is halted upon reaching the first insulative layer 333. Preferably this etch process is an isotropic etch process utilizing a SF6 plasma etch with a power of approximately 60 W, +/−20 W, a magnetic field strength of approximately 30 G, +/−20 G, a pressure of approximately 120 mT, +/−30 mT, a gas flow rate of approximately 40 sccm, +/−20 sccm SF6 and a bias voltage of approximately 50 V, for a 200 mm wafer. These parameters would have to be scaled accordingly for a 300 mm wafer. The low bias voltage of approximately 50 V produces very low ion energies, and consequently a high nitride to oxide selectivity. Such an etch process has a high selectivity to the underlying oxide and the resist mask, which makes the etch process easy to control. After the etch process, the photo resist mask layer 340 is removed, as seen in FIG. 6.

Figure 6:
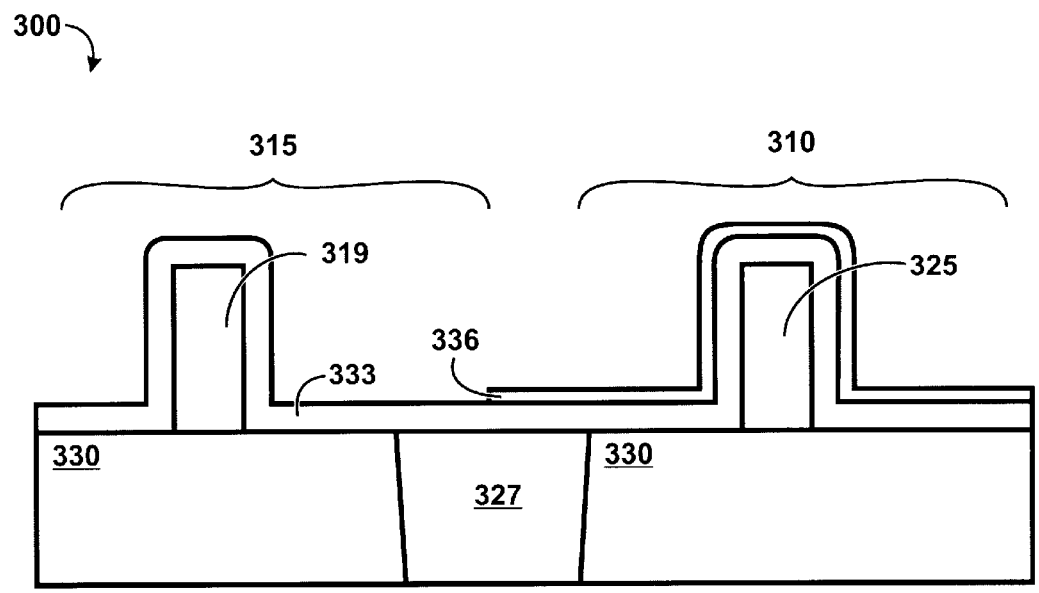

FIG. 6 illustrates portion 300 of FIG. 5 after removal of the photo resist mask layer. Photo resist mask removal can be accomplished utilizing wet chemistries such as a mixture of sulfuric acid and hydrogen peroxide. Alternately, the photo resist mask removal can be carried out through plasma processing, e.g., oxygen plasma, or other suitable methods as are known in the art. After removal of the mask layer, the second portion of the second insulative layer 336 overlying the PMOS transistor 310 is exposed, while the first (unprotected) portion of the second insulative layer is gone. The result is that the nitride/oxide stack over PMOS transistor 310 is unchanged, while only the first insulative layer 333 remains over the NMOS transistor 315. Portion 300 is now ready for the etching process to form differential spacer-0s, as shown in FIG. 7.

Figure 7:
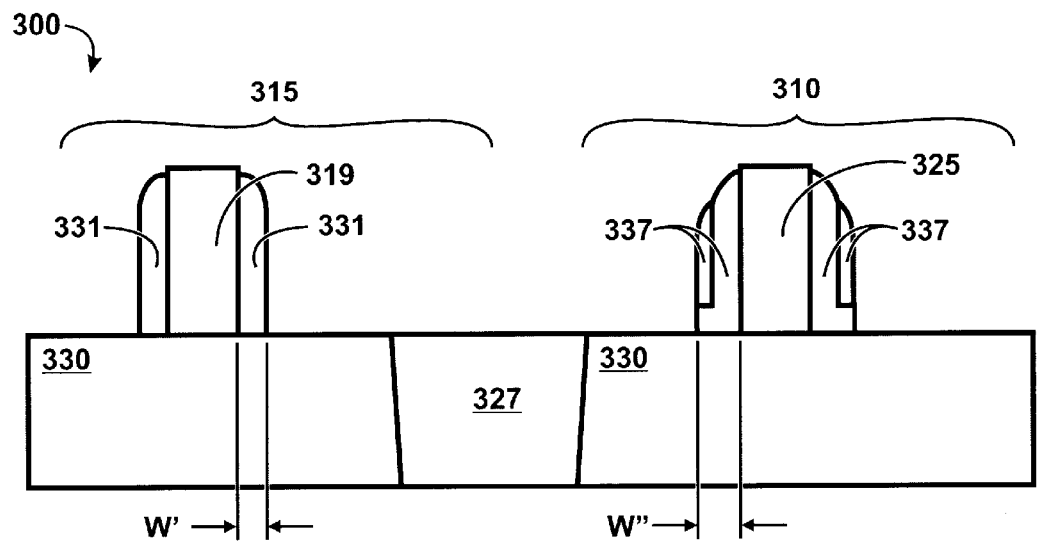

FIG. 7 illustrates portion 300 of FIG. 6 after spacer-0 etch. Portion 300 undergoes an anisotropic dry etch process to form a first spacer 331 abutting the gate structure 319 of the first transistor type (315), and a second spacer 337 abutting the gate structure 325 of the second transistor type (310). At the completion of the anisotropic etch, the resultant NMOS spacer-0 (331) has a final width of W', while the PMOS transistor 310 spacer-0 (337) has a greater width, W", than that of NMOS transistor 315 spacer 331. Applying the arbitrary values provided from the earlier example of 100 Angstroms thickness for the first insulative layer and 50 Angstroms thickness for the second insulative layer, and assuming no lateral etching during the dry etch process, the final width of first spacer 331 would be 100 Angstroms for NMOS transistor 315. The final width of the second spacer 337 would then be 100+50, or 150 Angstroms.

The first spacer 331 is comprised only of the material from the first insulative layer (333 in FIGS. 3–6), while the second spacer 337 is comprised of material from the first insulative layer (e.g., 333 in FIGS. 3–6) and the second insulative layer (335 in FIGS. 3–5). Due to the nature of the anisotropic dry etch process, the wider spacer 337 will have a 100 Angstrom L-shaped first insulative layer with a 50 Angstrom second insulative layer spacer abutting the L-shaped first insulative layer, when applying the arbitrary values previously mentioned.

Various plasma etch processes can be applied for the spacer etch process. For example, if the second insulative material is silicon nitride, silicon rich nitride, or silicon oxynitride, and the first insulative material is silicon oxide, a CHF3/CF4 chemistry would etch the second and first layers at about the same rate. In this case, optical emission spectroscopy (OES) endpoint can be used to detect when the CO emission drops off to halt the etch process. In addition, the CHF3/CF4 etch chemistry insures good selectivity to substrate 330. Use of endpoint as taught herein permits close monitoring during etch to avoid etching into the underlying silicon of substrate 330, thus avoiding the "silicon recess" problems associated with over-etching.

Another plasma etch process suitable to practice the teachings disclosed herein could utilize a CH3F/O2 in a first etch step to etch the nitride-containing layer very selectively to the oxide layer. This first etch can then be halted (endpointed) when the NH emission signal declines. The oxide layer can then be etched in a second etching step using CHF3/CF4 chemistry.

In an embodiment, another two-step etch process can be employed for the spacer etch. A first etch step using CH3F/O2 chemistry for etching the nitride-containing layer selectively to the oxide layer, combined with a second etch step using a C4F8 chemistry. The C4F8 based process etches oxide selective over nitride (the first spacer over the PMOS transistor) and silicon (the substrate). In this case, the C4F8 based process is analogous to a CHF3/CF4 based etching of silicon dioxide, in that optical emission spectroscopy (OES) endpoint can be used to detect when the CO emission drops off to halt the etch process.

FIGS. 8 through 12 illustrate, in cross-section, a portion 800 of a semiconductor device in an intermediate stage of processing according to an embodiment of the present disclosure. At the stage shown in FIG. 8, the isolation 827 in substrate 830, an N-type gate structure 819, and a P-type gate structure 825 have been formed. Semiconductor substrate 830 is preferably a mono-crystalline silicon substrate. Alternatively, substrate 830 can also be a silicon-on-insulator substrate, a silicon on sapphire substrate, or the like. N-type gate structure 819 and P-type gate structure 825 are preferably polysilicon, amorphous silicon, metals, or ceramic conductors having a width ranging from 5 to 500 nm. The brackets over the gate structures 819 and 825 indicate the areas of portion 800 which form transistors corresponding to a particular type of gate structure. Thus, N-type gate structure 819 is part of an NMOS transistor 815, while P-type gate structure 825 is part of a PMOS transistor 810.

A first insulative layer 833 is formed overlying a plurality of gate structures such as gate structure 819 and gate structure 825 of portion 800. In a preferred embodiment, first insulative layer 833 is conformally deposited by techniques well known in the art, e.g., LCPVD, PECVD, and the like, and comprises silicon nitride. Alternatively, first insulative layer 833 comprises a silicon-rich nitride. In other embodiments illustrated and discussed with reference to FIGS. 3–7, first insulative layer 833 comprises a silicon-rich oxide, or silicon oxide. In another embodiment, first insulative layer comprises silicon, nitrogen, and oxygen, e.g., a silicon oxynitride. The thickness of first insulative layer ranges from 50 to 500 Angstroms. For purposes of example, we shall again assign the arbitrary value of 100 Angstroms for the thickness of first insulative layer 833 with reference to FIGS. 8–12. Following formation of the first insulative layer 833, a second insulative layer 835 is formed overlying the first insulative layer 833.

Second insulative layer 835 is conformally deposited by techniques well known in the art, e.g., LPCVD, PECVD, and the like, and preferably comprises silicon oxide. In an embodiment, second insulative layer 835 comprises silicon, nitrogen, and oxygen, e.g., silicon oxynitride. The thickness of second insulative layer ranges from 30 to 300 Angstroms. For purposes of example, we shall again assign the arbitrary value of 50 Angstroms for the thickness of second insulative layer 835 with reference to FIGS. 8 through 12. After formation of second insulative layer 835, portion 800 is ready for masking, as shown in FIG. 9.

Figure 8:
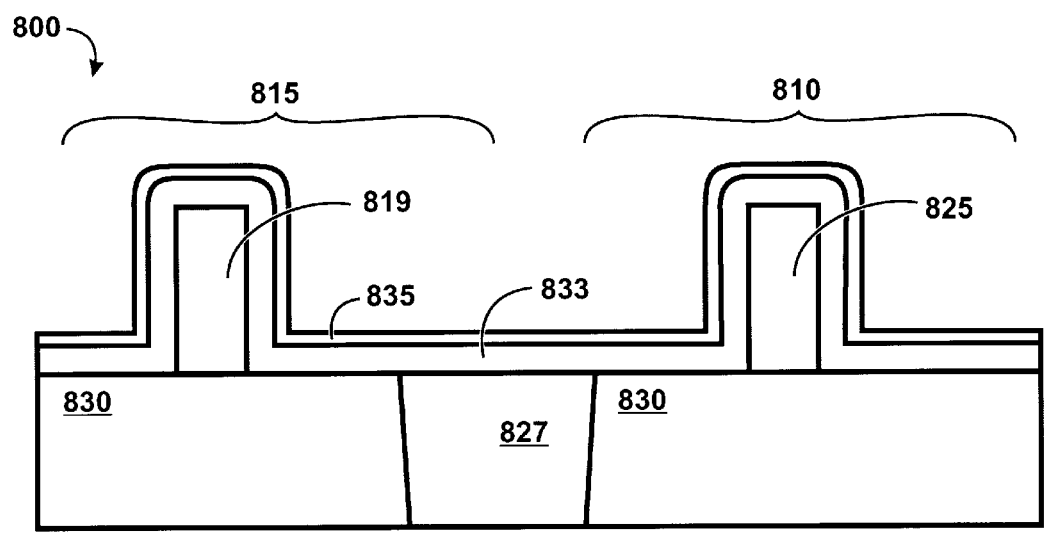
FIGS. 8–12 illustrate, in cross-section, semiconductor device manufacturing steps according to at least one embodiment of the present disclosure.
Figure 9:
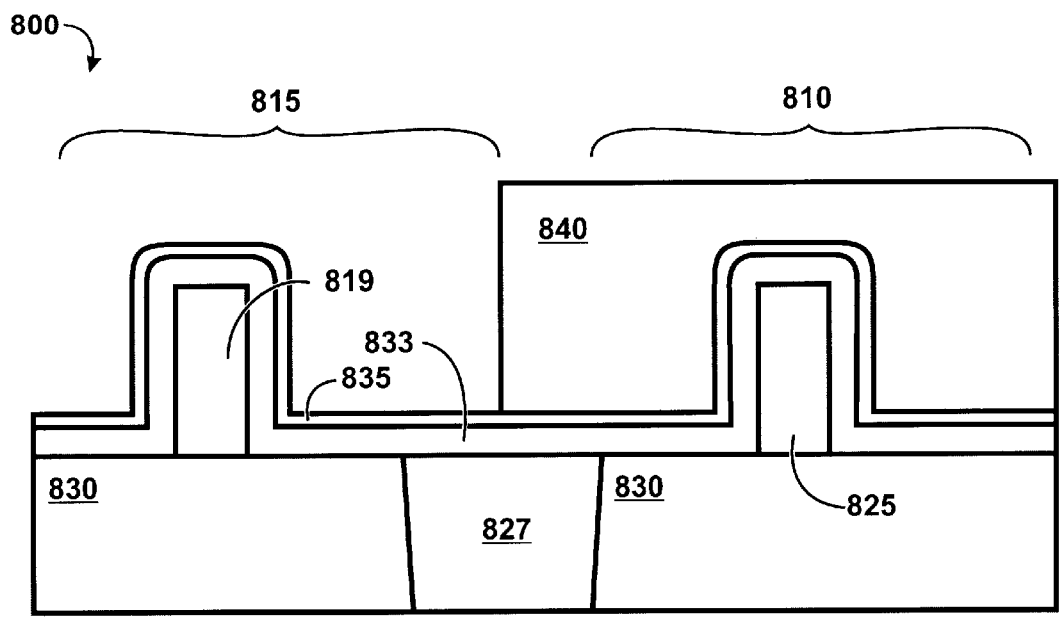

FIG. 9 illustrates portion 800 of FIG. 8 after masking areas of portion 800 for a photolithography process. A first photo resist mask layer 840 is formed to expose a first portion of the second insulative layer 835 where second insulative layer 835 overlies a gate structure of a first transistor type, e.g., the NMOS transistor 815. Mask layer 840 also serves to protect a second portion of the second insulative layer 835 where layer 835 overlies a gate structure of a second transistor type, e.g., the PMOS transistor 810. It should be appreciated that although the mask layer 840 is shown protecting the PMOS transistor 810, should the needs of the practitioner require it, mask 840 could be used to protect the NMOS transistor 815 and expose the PMOS transistor 810. This would result in the formation of a wider spacer over the NMOS transistor 815 than that of the spacer for the PMOS transistor 810 when practicing the teachings of the present method. Following the application of mask 840 for the photolithographic process, portion 800 is subjected to an etch to remove the exposed portion of the second insulative layer 835, as shown in FIG. 10.

Figure 10:
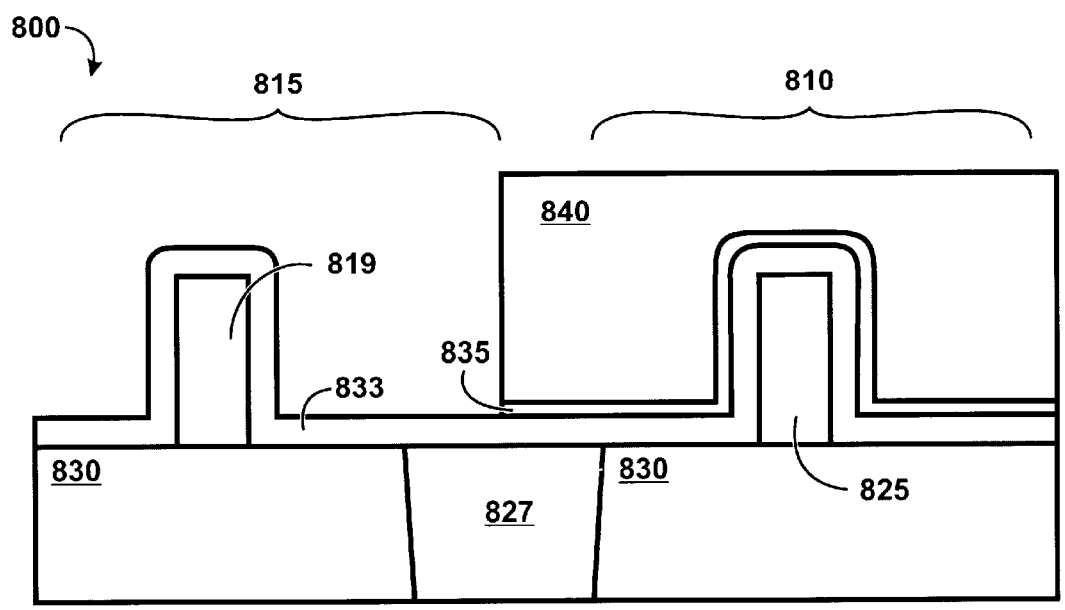

FIG. 10 illustrates portion 800 of FIG. 9 after etching to remove the exposed first portion of the second insulative layer 835 from the NMOS transistor 815. Etch of the exposed first portion of second layer 835 is halted upon reaching the first insulative layer 833. Preferably this etch process is an isotropic wet etch utilizing hydrofluoric acid (HF). HF in various dilutions with water (H2O), or a buffered oxide etch (BOE) etches oxide selectively over nitride and photo resist. When an HF/H2O wet etch is utilized, the ratio of HF:H2O is in the range of 1:10 through 1:100. When a BOE wet etch is utilized, the chemistry is generally HF+NH4+H2O, as known in the art. After the etch process, the photo resist mask layer 840 is removed, as seen in FIG. 11.

Figure 11:
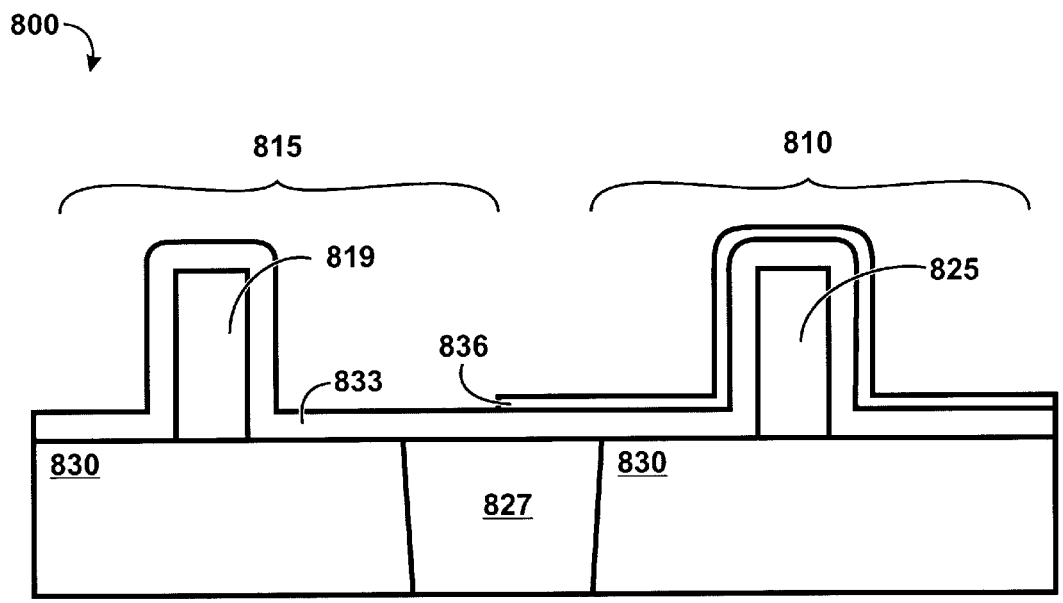

FIG. 11 illustrates portion 800 of FIG. 10 after removal of the photo resist mask layer. Photo resist mask removal can be accomplished utilizing wet chemistries such as a mixture of sulfuric acid and hydrogen peroxide. Alternately, photo resist mask removal can be carried out through plasma processing, e.g., oxygen plasma, or other suitable methods as are known in the art. After removal of the mask layer, the second portion of the second insulative layer 836 overlying the PMOS transistor 810 is exposed, while the first (unprotected) portion of the second insulative layer is gone. The result is that the oxide/nitride stack over PMOS transistor 810 is unchanged, while only the first insulative layer 833 remains over the NMOS transistor 815. Portion 800 is now ready for the etching process to form differential spacers, as shown in FIG. 12.

Figure 12:
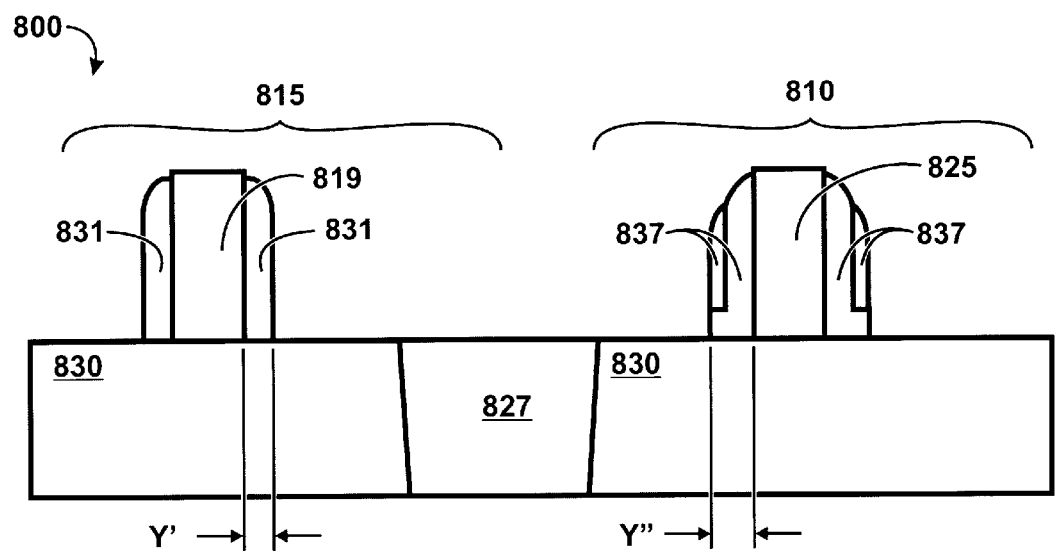

FIG. 12 illustrates portion 800 of FIG. 11 after spacer-0 etch. Portion 800 undergoes an anisotropic dry etch process to form a first spacer 831 abutting the gate structure 819 of the first transistor type (815), and a second spacer 837 abutting the gate structure 825 of the second transistor type (810). At the completion of the anisotropic etch, the resultant NMOS spacer-0 (831) has a final width of Y', while the PMOS transistor 810 spacer-0 (837) has a greater width, Y", than that of NMOS transistor 815 spacer 831. Applying the arbitrary values provided from the earlier example of 100 Angstroms thickness for the first insulative layer and 50 Angstroms thickness for the second insulative layer, and assuming no lateral etching during the dry etch process, the final width of first spacer 831 would be 100 Angstroms for NMOS transistor 815. The final width of the second spacer 837 would then be 100+50, or 150 Angstroms.

The first spacer 831 is comprised only of the material from the first insulative layer (833 in FIGS. 8–11), while the second spacer 837 is comprised of material from the first insulative layer (e.g., 833 in FIGS. 8–11) and the second insulative layer (835 in FIGS. 8–10). Due to the nature of the anisotropic dry etch process, the wider spacer 837 will have a 100 Angstrom L-shaped first insulative layer with a 50 Angstrom second insulative layer spacer abutting the L-shaped first insulative layer, if applying the arbitrary values previously mentioned.

As before, various plasma etch chemistries may be employed during the spacer etch process. For example, a CHF3/CF4 chemistry would etch the oxide and nitride layers at approximately the same rate. Optical emission is utilized during the etch process, and an endpoint from the CN line is used to stop the etch process upon clearance of the first insulative layer (no over-etch). Use of an endpoint as disclosed herein permits sufficient control (monitoring) during etch to avoid etching into the underlying silicon of substrate 830, thus avoiding the "silicon recess" problems associated with over-etching.

In an embodiment, a viable plasma etch chemistry suitable for the anisotropic dry etch to form differential spacers can utilize a two step etch process, for example a C4F8 chemistry could etch an oxide spacer in a first step, as the C4F8 chemistry is selective to nitride. The second step could etch the nitride to complete spacer formation by using a CHF3/CF4 chemistry. This two-step process permits a simpler endpoint detection—when the CN emission signal drops, the etch process is halted.

Alternately, another two-step etch process can be employed for the spacer etch. A C4F8 chemistry etching oxide in the first step could be combined with a second step using a CH3F/O2 chemistry, which etches nitride with good selectivity to silicon and oxide. This two-step process permits endpoint detection by using the NH or CN emission signal decline.

The methodology disclosed herein provides the process engineer with flexibility in a CMOS device fabrication process. For example, in an embodiment of the present disclosure, which is not illustrated herein, deep S/D spacers may be formed after the formation of the differential spacers and the S/D extension and halo implants. The S/D regions and the halo implants are not illustrated in FIGS. 3–12 in order to keep the drawings straightforward. However, those of skill in the art know that subsequent to the differential spacer etch process as taught herein with reference to FIGS. 3–7 and 8–12, other lithography masking and ion implantation steps are needed to form the shallow S/D extensions. The etch process for these deep S/D spacers would be halted using endpoint detection via optical emission, in a similar manner as those presented for the etch processes to form differential spacers taught herein.

The method and apparatus herein provides for a flexible implementation. Although the invention has been described using certain specific examples, it will be apparent to those skilled in the art that the invention is not limited to these few examples. For example, the disclosure is discussed herein primarily with regard to spacer formation for a CMOS device, however, the invention can be employed with other device technologies to create differential spacers during device manufacture. Additionally, various types of deposition and etch devices are currently available which could be suitable for use in employing the method as taught herein. Note also, that although an embodiment of the present invention has been shown and described in detail herein, along with certain variants thereof, many other varied embodiments that incorporate the teachings of the invention may be easily constructed by those skilled in the art. Benefits, other advantages, and solutions to problems have been described above with regard to specific embodiments.

However, the benefits, advantages, solutions to problems, and any element(s) that may cause any benefit, advantage, or solution to occur or become more pronounced are not to be construed as a critical, required, or essential feature or element of any or all the claims. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method of fabricating an integrated circuit, said method comprising:

forming a first insulative layer overlying a plurality of gate structures;

forming a second insulative layer overlying the first insulative layer;

forming a first masking layer to expose a first portion of the second insulative layer which overlies a gate structure of a first transistor type and to protect a second portion of the second insulative layer which overlies a gate structure of a second transistor type within the plurality of gate structures; and etching the exposed first portion of the second insulative layer overlying the gate structure of the first transistor type;

halting etching of the exposed first portion of the second insulative layer upon reaching the first insulative layer;

removing the first masking layer to expose the second portion of the second insulative layer which overlies the gate structure of the second transistor type; and anisotropically etching the exposed second portion of the second insulative layer and the first insulative layer to form a first spacer abutting the gate structure of the first transistor type and a second spacer abutting the gate structure of the second type.

2. The method of claim 1, wherein the second spacer has a width greater than the width of the first spacer.

3. The method of claim 1, wherein the first transistor type is a N-type transistor and the second transistor type is a P-type transistor.

4. The method of claim 1, wherein the first transistor type is a P-type transistor and the second transistor type is a N-type transistor.

5. The method of claim 1, wherein the first insulative layer comprises silicon oxide.

6. The method of claim 5, wherein the first insulative layer comprises a silicon-rich oxide.

7. The method of claim 5, wherein the first insulative layer comprises silicon, nitrogen, and oxygen.

8. The method of claim 5, wherein the second insulative layer comprises silicon nitride.

9. The method of claim 5, wherein the second insulative layer comprises a silicon-rich nitride.

10. The method of claim 5, wherein etching is an isotropic etch process.

11. The method of claim 10, wherein the isotropic etch process utilizes a SF6 plasma etch with a power of approximately 60 W, plus or minus 20 W; a magnetic field of approximately 30 G, plus or minus 20 G; a pressure of approximately 120 mT, plus or minus 30 mT; a SF6 gas flow of approximately 40 sccm, plus or minus 20 sccm; and a bias voltage of approximately 50 V.

12. The method of claim 1, wherein the first insulative layer comprises silicon nitride.

13. The method of claim 12, wherein the first insulative layer comprises a silicon-rich nitride.

14. The method of claim 12, wherein the second insulative layer comprises silicon oxynitride.

15. The method of claim 12, wherein the second insulative layer comprises silicon oxide.

16. The method of claim 1 wherein the first insulative layer thickness ranges between 50 and 500 Angstroms.

17. The method of claim 1, wherein the second insulative layer thickness ranges between 30 and 300 Angstroms.

18. The method of claim 1, wherein etching the exposed first portion of the second insulative layer utilizes an isotropic etch process.

19. The method of claim 1, wherein etching the exposed first portion of the second insulative layer utilizes a SF6 plasma etch with a power of approximately 60 W, plus or minus 20 W; a magnetic field of approximately 30 G, plus or minus 20 G; a pressure of approximately 120 mT, plus or minus 30 mT; a SF6 gas flow of approximately 40 sccm, plus or minus 20 sccm; and a bias voltage of approximately 50 V.

* * * * *